(12) United States Patent
Niwa (10) Patent No.: US 9,059,711 B2
(45) Date of Patent: Jun. 16, 2015

(54) DETECTION DEVICE (75) Inventor: Masahisa Niwa, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 113 days.

(21) Appl. No.: 13/816,602

(22) PCT Filed: Aug. 16, 2011

(86) PCT No.: PCT/IB2011/001880
§ 371 (c)(1),
(2), (4) Date: Feb. 12, 2013

(87) PCT Pub. No.: WO2012/023023
PCT Pub. Date: Feb. 23, 2012

(65) Prior Publication Data
US 2013/0141155 A1 Jun. 6, 2013

(30) Foreign Application Priority Data
Aug. 17, 2010 (JP) ................. 2010-182487

(51) Int. Cl.
G01R 27/28 (2006.01)
H03K 17/945 (2006.01)
H03K 17/95 (2006.01)

(52) U.S. Cl.
CPC .......... H03K 17/945 (2013.01); H03K 17/9542 (2013.01)

(58) Field of Classification Search
USPC ................. 324/652, 500, 512, 522, 530–537, 324/546–550, 762.01, 762.09; 323/282, 323/271, 222, 268, 299, 303, 225
See application file for complete search history.

(56) References Cited

U.S. PATENT DOCUMENTS

| 2008/0129298 A1* | 6/2008 | Vaughan et al. ............. 324/322 |
| 2010/0079123 A1* | 4/2010 | Miyamae ..................... 323/282 |
| 2012/0119751 A1* | 5/2012 | Scott et al. .................... 324/509 |

FOREIGN PATENT DOCUMENTS

| JP | H7-37475 | 2/1995 |
| JP | 2004-156312 | 6/2004 |
| JP | 2007-208843 | 8/2007 |
| JP | 2010-45531 | 2/2010 |

OTHER PUBLICATIONS

International Search Report for corresponding International Application No. PCT/IB2011/001880 mailed Nov. 22, 2011.
Form PCT/ISA/237 for corresponding International Application No. PCT/IB2011/001880 dated Nov. 22, 2011.

* cited by examiner

Primary Examiner — Melissa Koval
Assistant Examiner — Trung Nguyen
(74) Attorney, Agent, or Firm — Renner, Otto, Boisselle & Sklar, LLP (57) ABSTRACT A detection device includes a resonance unit having a coil and a capacitor, an oscillation unit for oscillating the resonance unit, and a signal processing unit for detecting the oscillation state of the resonance unit and outputting an object detection signal when oscillation is stopped. The signal processing unit intermittently executes a self-diagnosis mode by forcibly oscillating the oscillation unit to determine whether or not an abnormality occurs in the resonance unit.

14 Claims, 6 Drawing Sheets

DETECTION DEVICE

FIELD OF THE INVENTION

The present invention relates to a detection device for detecting an object in a non-contact manner.

BACKGROUND OF THE INVENTION

Conventionally, a proximity sensor described in Japanese Patent Publication No. 2010-45531 (JP2010-45531A) is provided as a device for detecting an object in a non-contact manner. In a prior art described in JP2010-45531A, an oscillation circuit includes an LC resonance circuit having a detection coil and a capacitor. When the oscillation circuit is oscillated and an object including a metallic body (conductor) or a magnetic body approaches the detection coil, the conductance of the detection coil is decreased, and thus, oscillation of the oscillation circuit stops. Thus, the existence (approach) of the object is detected as the oscillation stops. In addition, in the prior art of JP2010-45531A, whether or not the disconnection of the detection coil occurs is detected by observing amplitude of oscillation (resonant voltage of the LC resonance circuit) of the oscillation circuit.

However, in the prior art of JP2010-45531A, since the oscillation of the oscillation circuit stops when the object approaches the detection coil, it is difficult to determine whether the oscillation is stopped by an abnormality (disconnection or short circuit of the detection coil) of the LC resonance circuit or the oscillation is stopped normally due to the approach of the object.

SUMMARY OF THE INVENTION

In view of the above, the present invention provides a detection device capable of detecting an abnormality such as a disconnection, short circuit or the like even when an object is detected.

In accordance with an aspect of the present invention, there is provide a detection device including: a resonance unit including a coil and a capacitor; an oscillation unit for oscillating the resonance unit; and a signal processing unit for detecting an oscillation state of the resonance unit and outputting an object detection signal when the oscillation is stopped. The signal processing unit intermittently executes a self-diagnosis mode for determining whether or not an abnormality occurs in the resonance unit by forcibly oscillating the oscillation unit.

The signal processing unit may forcibly oscillate the oscillation unit by increasing an absolute value of negative conductance of the oscillation unit.

The signal processing unit may forcibly oscillate the oscillation unit by increasing the absolute value of the negative conductance of the oscillation unit to be larger than a maximum value of conductance of the resonance unit. The signal processing unit may forcibly oscillate the oscillation unit by applying a pulse voltage or a pulse current to the resonance unit.

The signal processing unit preferably outputs an abnormality detection signal different from the object detection signal when the abnormality is determined in the self-diagnosis mode.

The signal processing unit preferably continues outputting the abnormality detection signal until it is determined that there is no abnormality.

In a case where it is determined that there is no abnormality during execution of the self-diagnosis mode, if the object detection signal is outputted just before execution of the self-diagnosis, the signal processing unit preferably continues outputting the object detection signal.

The signal processing unit preferably outputs a signal different from the object detection signal during execution of the self-diagnosis mode.

The signal processing unit may periodically execute the self-diagnosis mode.

The signal processing unit preferably executes the self-diagnosis mode when it is detected that the oscillation of the resonance unit is stopped while the self-diagnosis mode is not executed.

The signal processing unit preferably executes the self-diagnosis mode only once immediately after the oscillation stop is detected.

The signal processing unit may execute the self-diagnosis mode only once immediately after starting to operate.

The signal processing unit may forcibly stop the oscillation of the resonance unit when the self-diagnosis mode is completed.

When the self-diagnosis mode is completed, the signal processing unit may forcibly stop the oscillation of the resonance unit only in a case where the object detection signal is outputted just before execution of the self-diagnosis mode.

In accordance with the embodiments of the present invention, there is an advantageous effect in that an abnormality such as a disconnection or short circuit can be detected even when an object is detected.

BRIEF DESCRIPTION OF THE DRAWINGS

The objects and features of the present invention will be apparent from the following description of preferred embodiments given in conjunction with the accompanying drawings, in which.

DETAILED DESCRIPTION OF THE EMBODIMENTS

Hereinafter, embodiments of the present invention will be described in detail with reference to the accompanying drawings which form a part hereof. Throughout the drawings, like reference numerals are used to designate like or similar parts and redundant descriptions thereof will be omitted.

Hereinafter, embodiments in which the technical feature of the present invention is applied to a detection device described in the background of the invention which detects the existence of an object including a metallic body (conductor) or a magnetic body based on a change in conductance of a detection coil. In addition, the technical feature of the present invention can be applied to a detection device which detects the existence of an object such as moisture, a human body containing moisture or the like based on a change in conductance of a capacitor configuring a resonance circuit together with a coil.

First Embodiment

Figure 2:
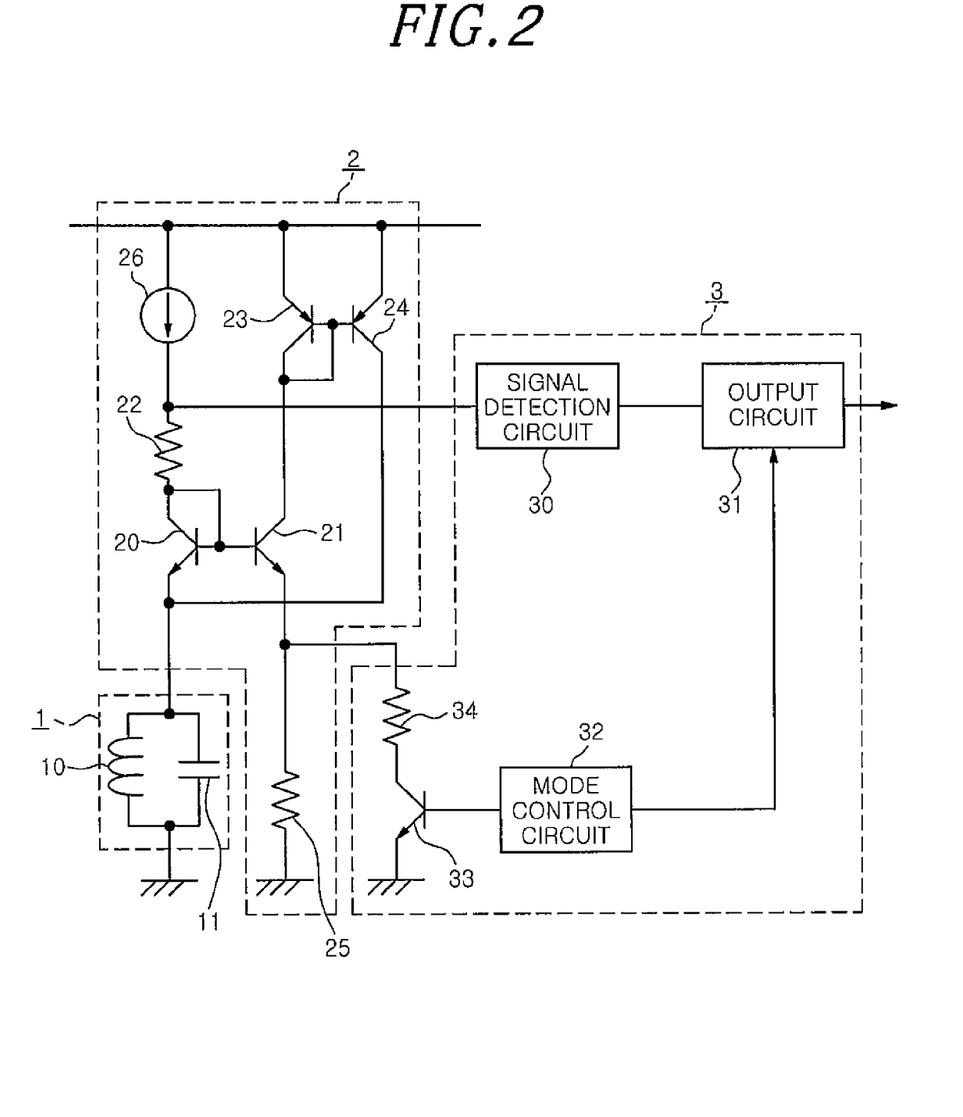
FIG. 2 is a view schematically showing the configuration of the first embodiment.

A detection device in accordance with the present embodiment includes a resonance unit 1, an oscillation unit 2 and a signal processing unit 3 as shown in FIG. 2.

The resonance unit 1 is an LC resonance circuit in which a capacitor (resonance capacitor) 11 is connected in parallel to a detection coil 10 for detecting an object to be detected. The resonance frequency (oscillation frequency) of the resonance unit 1 is determined by the inductance of the detection coil 10 and the electrostatic capacity of the capacitor 11. The detection coil 10 is configured, e.g., by winding a conducing wire (insulation coating wire or the like) around an outer peripheral surface of a cylindrical coil bobbin (not shown) in an axis direction of the coil bobbin in the form that the coil runs in a winding direction. The object to be detected may be formed, e.g., of a conductor such as a metallic body or the like in the shape of a plate, face the detection coil 10 along the winding direction of the detection coil 10 and move in a direction to change a distance from the detection coil 10.

In order to maintain oscillation of the resonance unit 1 positive feedback of current to the resonance unit 1 is needed. Therefore, the oscillation unit 2 is to supply the feedback current to the resonance unit 1 and includes a level shift circuit, an amplifying circuit and a current feedback circuit. Here, the level shift circuit shifts the level of voltage between both ends of the capacitor 11 of the resonance unit 1. The amplifying circuit outputs a current corresponding to the voltage of the resonance unit 1. The current feedback circuit supplies the resonance unit 1 with a feedback current corresponding to the magnitude of the current outputted from the amplifying circuit, thereby maintaining the oscillation.

The level shift circuit includes an NPN transistor 20. The collector of the transistor 20 is connected to a constant current source 26 via a resistor 22. The emitter of the transistor 20 is connected to one end of the resonance unit 1, of which the other end is grounded. In addition, in the present embodiment, the resonance unit 1 including the detection coil 10 and the capacitor 11 is inserted between the emitter of the transistor 20 and a ground. Accordingly, the electric potential of the emitter of the transistor 20 is the same as the oscillation voltage of the resonance unit 1. In addition, the collector and the base of the transistor 20 are connected to each other.

The level shift circuit shifts the level of the resonance voltage as much as the voltage between the base and the emitter of an NPN transistor 21 of the amplifying circuit, thereby making a voltage equal to the resonance voltage (oscillation voltage) of the resonance unit 1 to be applied between the emitter of the transistor 21 and the ground during only a half positive cycle when the oscillation is generated.

The amplifying circuit is configured with a so-called an emitter follower circuit including the transistor 21. The base of the transistor 21 is connected to the base of the transistor 20, and the electric potential of the emitter of the transistor 20, the level of which is shifted by the level shift circuit, i.e., the level shift voltage generated by the level shift circuit, is inputted into the base of the transistor 21. Accordingly, a current corresponding to the oscillation voltage of the resonance unit 1 is outputted from the amplifying circuit.

A resistor 25 for setting the electric potential of the emitter is inserted between the output terminal (the emitter of the transistor 21) of the amplifying circuit and the ground. The resistor 25 is to adjust the magnitude of the current outputted from the amplifying circuit, i.e., the magnitude of the feedback current. The feedback current adjusted by the value of the resistor 25 is supplied to the resonance unit 1.

The current feedback circuit is a current mirror circuit including PNP transistors 23 and 24. The transistor 23 is provided between the transistor 21 of the amplifying circuit and the power line, wherein the collector of the transistor 23 is connected to the collector of the transistor 21 and the emitter of the transistor 23 is connected to the power line. The base of the transistor 23 is connected to the base of the transistor 24, the emitter of the transistor 24 is connected to the power line, and the collector of the transistor 24 is connected to the emitter of the transistor 20.

Here, when a current is outputted from the amplifying circuit, a collector current of the transistor 21 equal to the current outputted from the amplifying circuit flows between the emitter and the collector of the transistor 23. Then, a current equal to the current flowing between the emitter and the collector of the transistor 23 flows between the emitter and the collector of the transistor 24, and this current is the feedback current supplied to the resonance unit 1. That is, the current feedback circuit supplies the resonance unit 1 with the feedback current equal to the current outputted from the amplifying circuit.

The signal processing unit 3 includes a signal detection circuit 30, an output circuit 31, a mode control circuit 32 and the like. The signal detection circuit 30 detects an oscillation state (oscillation amplitude in the illustrated embodiment) of the resonance unit 1. When the oscillation amplitude is lower than a predetermined threshold value, the signal processing unit 3 determines that the oscillation of the resonance unit 1 is stopped and outputs an oscillation stop signal. However, the signal detection circuit 30 may detect an oscillation frequency instead of the oscillation amplitude.

In an object detection mode which will be described below, the output circuit 31 outputs a detection signal indicating that an object to be detected (hereinafter, referred to as an object) exists within a detection range or a non-detection signal indicating that no object exists within the detection range, based on the oscillation stop signal of the signal detection circuit 30. In addition, in a self-diagnosis mode, which will be described below, the output circuit 31 outputs an abnormality detection signal indicating that an abnormality (disconnection or short circuit) occurs in the resonance unit 1, based on the oscillation stop signal of the signal detection circuit 30.

Figure 1:
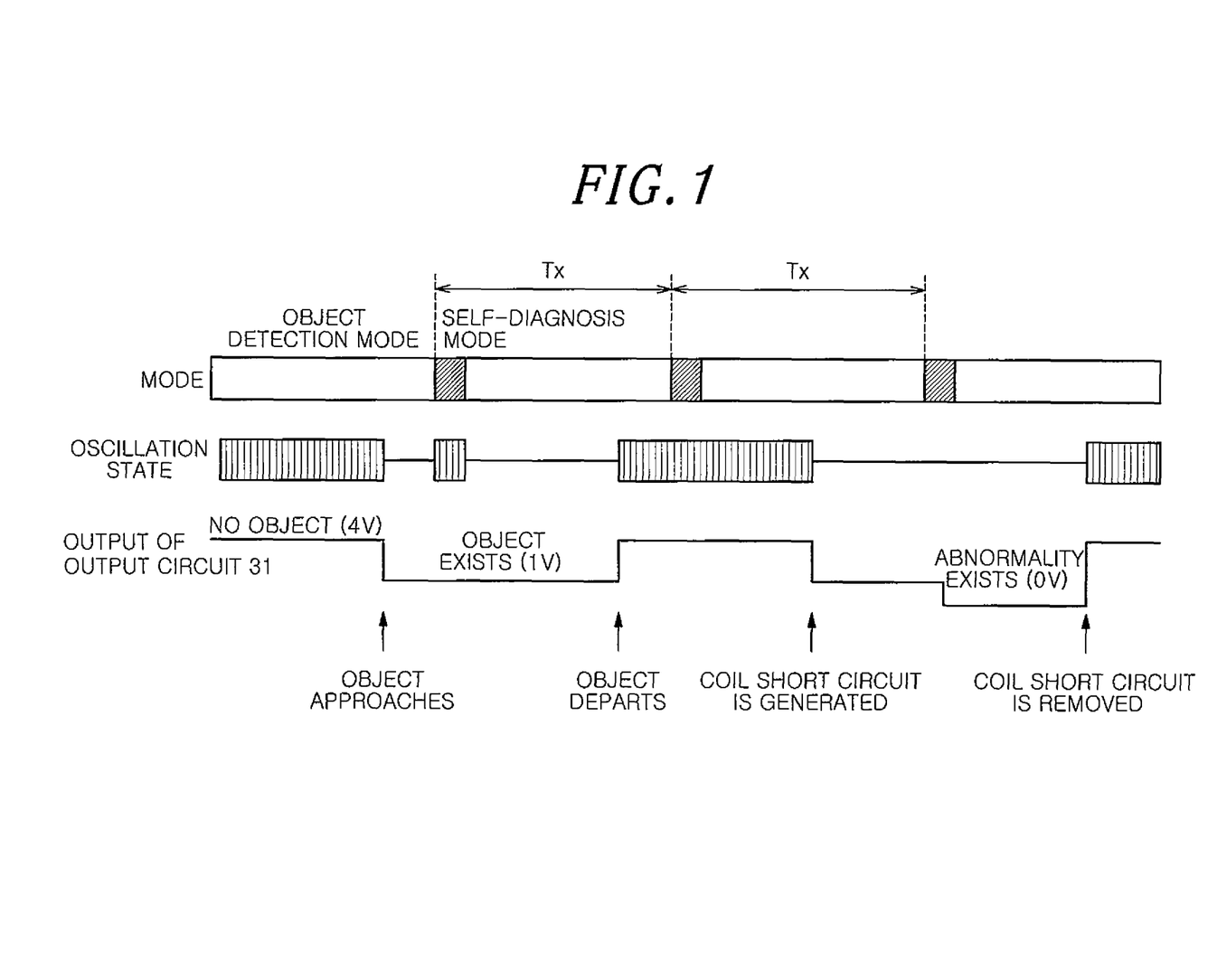
FIG. 1 is a time chart illustrating the operation of a first embodiment.

The mode control circuit 32 selectively switches the operation mode of the signal processing unit 3 to either the object detection mode or the self-diagnosis mode by turning on or off an NPN transistor 33 having a collector connected to the emitter of the transistor 21 via the resistor 34 and an emitter connected to a ground. The mode control circuit 32 turns off the transistor 33 and outputs a switch signal of high level to the output circuit 31 in the object detection mode. Further, the mode control circuit 32 turns on the transistor 33 and outputs a switch signal of low level to the output circuit 31 in the self-diagnosis mode. In addition, the mode control circuit 32 has a timer therein and thus periodically switches the operation mode of the signal processing unit 3 from the object detection mode to the self-diagnosis mode at regular intervals Tx as shown in FIG. 1.

Here, when the absolute value of the negative conductance of the oscillation unit 2 is equal to or higher than the conductance of the detection coil 10, the resonance unit 1 oscillates, and when the absolute value of the negative conductance of the oscillation unit 2 is lower than the conductance of the detection coil 10, the oscillation amplitude of the resonance unit 1 is greatly reduced, and thus, the oscillation thereof is stopped. In addition, the conductance of the detection coil 10 (see a curved line in FIG. 3) varies depending on a change in loss of eddy current caused by the distance between the object and the detection coil 10, i.e., depending on the distance between the detection coil 10 and the object (a horizontal axis in FIG. 3).

Figure 3:
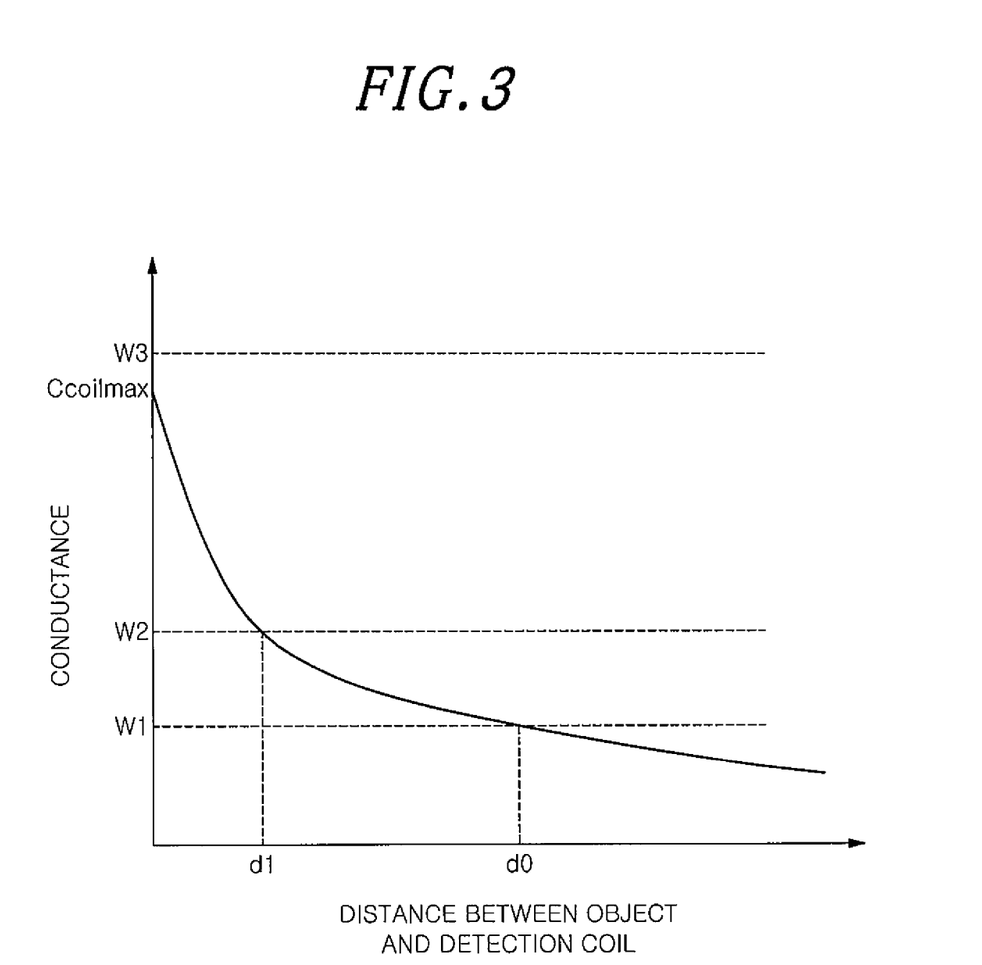
FIG. 3 is a view illustrating the operation of the first embodiment.

Here, assuming that the absolute value of the negative conductance of the oscillation unit 2 is set to be W1 so as to oscillate the resonance unit 1 when the object does not exist within the detection range (≤d0), when the object is within the detection range, the absolute value of the negative conductance of the oscillation unit 2 becomes less than the conductance of the detection coil 10, and thus, the oscillation of the resonance unit 1 is stopped. In addition, in the object detection mode, the absolute value of the negative conductance of the oscillation unit 2 can be expressed as 1/(2Ra), where the resistance of the resistor 25 is Ra.

However, in the self-diagnosis mode, since the resistor 25 of the oscillation unit 2 and the resistor 34 (the resistance of which is Rb) of the signal processing unit 3 are connected in parallel to each other when the mode control circuit 32 turns on the transistor 33, the resistance of the combined resistors (hereinafter, expressed as Ra//Rb) becomes smaller than the resistance Ra of the resistor 25. Therefore, the absolute value of the negative conductance of the oscillation unit 2 becomes 1/(2×Ra//Rb) in the self-diagnosis mode and increases more than the absolute value of the negative conductance (=1/(2Ra)] in the object detection mode, e.g., to be W2 (>W1) (see FIG. 3).

In the self-diagnosis mode, since the absolute value of the negative conductance of the oscillation unit 2 is determined by the resistance Rb of the resistor 34, the resistance Rb of the resistor 34 can be set appropriately.

Thus, the absolute value of the negative conductance of the oscillation unit 2 may be set to be a value W3 larger than the maximum value Gcoilmax of the conductance of the detection coil 10. In addition, the aforementioned method of increasing or decreasing the absolute value of the negative conductance of the oscillation unit 2 is only an example, and the conductance of the detection coil 10 may be increased or decreased by another method.

For example, it is assumed that the absolute value of the negative conductance of the oscillation unit 2 is set to be W2 in the self-diagnosis mode. In this case, when the mode control circuit 32 turns on the transistor 33 to switch to the self-diagnosis mode, the oscillation condition is satisfied. Thus, even though the distance between the object and the detection coil 10 is within a range of d0 to d1 (<d0), the resonance unit 1 is forcibly oscillated as long as an abnormality such as a disconnection or short circuit does not occur.

When the oscillation amplitude is less than the predetermined threshold value, the signal detection circuit determines that the oscillation has been stopped and outputs an oscillation stop signal (e.g., DC voltage signal of low level). When the oscillation amplitude exceeds the threshold value, the signal detection circuit 30 determines that the oscillation has been started (resumed) and stops outputting the oscillation stop signal (e.g., outputs a DC voltage signal of high level).

Then, when the oscillation stop signal is outputted from the signal detection circuit 30 in the object detection mode as shown in FIG. 1, the output circuit 31 determines that the object is within the detection range and outputs an object detection signal of a predetermined DC voltage level (e.g., 1 volt). On the other hand, when the oscillation stop signal is not outputted from the signal detection circuit 30, the output circuit 31 determines that the object does not exist within the detection range and outputs a signal (object non-detection signal) of a predetermined DC voltage level (e.g., 4 volts).

In addition, when the oscillation stop signal is outputted from the signal detection circuit 30 in the self-diagnosis mode, the output circuit 31 determines that there is a disconnection or short circuit in the resonance unit 1 and outputs an abnormality detection signal of a predetermined DC voltage level (e.g., 0 volt). On the other hand, when no oscillation stop signal is outputted from the signal detection circuit 30 in the self-diagnosis mode, the output circuit 31 determines that there is no abnormality in the resonance unit 1 and does not output the abnormality detection signal.

Accordingly, it becomes known on the outside that the object is within the detection range or an abnormality occurs in the resonance unit 1 when the DC voltage level of the signal output from the output circuit 31 is 1 volt or that the object does not exist within the detection range when the DC voltage level is 4 volts. In addition, it becomes known on the outside that an abnormality occurs in the resonance unit 1 when the DC voltage level of the signal outputted from the output circuit 31 is a DC voltage level (0 volt), which is different from the DC voltage level (1 volts) of the object detection signal and the DC voltage level (4 volt) of the object non-detection signal. However, each value of the DC voltage levels of the signals outputted from the output circuit 31 is only an example, and it is not limited to the exemplified value.

In the self-diagnosis mode in which the resonance unit 1 is forcibly oscillated as described above, although an object exists within the detection range, the oscillation will be started (resumed) as long as no abnormality (disconnection or short circuit) occurs in the resonance unit 1. Accordingly, when the oscillation of the resonance unit 1 is stopped in the self-diagnosis mode, the signal processing unit 3 may determine that an abnormality has occurred in the resonance unit 1. For that reason, in the present embodiment, an abnormality (i.e., an abnormality of the resonance unit 1) such as a disconnection or short circuit can be detected even when an object is detected.

In addition, although an object cannot be detected in the self-diagnosis mode, detection errors of failing to detect existence of an object can be suppressed because the self-diagnosis mode is intermittently executed in the present embodiment. In addition, it is natural that if the oscillation of the resonance unit 1 is not stopped in the object detection mode, it can be determined that an abnormality has not occurred in the resonance unit 1.

Further, it is preferable that the signal processing unit 3 continues outputting the abnormality detection signal until it is determined that there is no abnormality (see FIG. 1). That is, if the abnormality detection signal is outputted only during the execution period of the self-diagnosis mode, an external device for receiving the signal from the output circuit 31 may not recognize the abnormality detection signal because duration of outputting the abnormality detection signal is too short. Therefore, in the present embodiment, when the signal processing unit 31 determines that an abnormality occurs in the self-diagnosis mode, the abnormality detection signal is continuously outputted even when the self-diagnosis mode is completed and switched to the object detection mode, thereby allowing the external device to securely recognize the abnormality detection signal.

However, when the abnormality of the resonance unit 1 is resolved and the oscillation is resumed, the signal processing unit 3 does not wait for the determination that no abnormality occurs in the self-diagnosis mode and stops outputting the abnormality detection signal at the moment when the oscillation of the resonance unit 1 is confirmed in the object detection mode (see FIG. 1). Accordingly, after the abnormality of the resonance unit 1 is resolved, an object can be detected immediately.

In addition, in a case where the signal processing unit 3 determines that there is no abnormality while the self-diagnosis mode is executed, if an object is detected (the object detection signal is output) in the object detection mode just before the execution of the self-diagnosis mode, it is preferable to continue outputting the object detection signal. That is, when an execution period of the self-diagnosis mode is sufficiently shorter than that of the object detection mode, it is expected that existing situation of the object is less likely to be changed before and after the execution period of the self-diagnosis mode. Further, although the signal processing unit 3 continues outputting the object detection signal during the short period of executing the self-diagnosis mode, it is expected that there will be no problem in practice because the signal processing unit 3 immediately detects whether an object exists or not at the moment when the self-diagnosis mode is switched to the object detection mode.

Second Embodiment

The present embodiment is characterized in that the resonance unit 1 is forcibly oscillated by the signal processing unit 3 in the self-diagnosis mode, and the other configurations are common to those of first embodiment. Therefore, the same constitutional elements as those of first embodiment will be denoted by the same reference numerals, and the descriptions thereof will be omitted.

Figure 4:
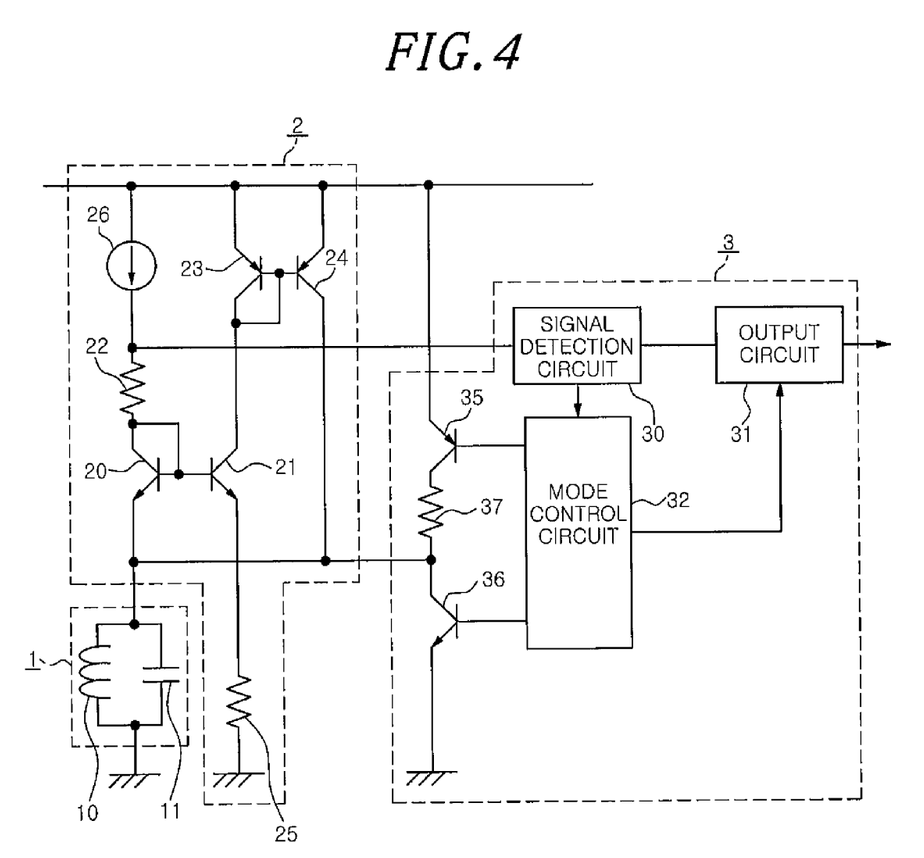
FIG. 4 is a view schematically showing the configuration of a second embodiment.

In the present embodiment, as shown in FIG. 4, the signal processing unit 3 is provided with two transistors 35 and 36 connected in series via the resistor 37, instead of the transistor 33 and the resistor 34 in the first embodiment. The PNP transistor 35 has an emitter connected to the power line and a collector connected to one end of the resistor 37. Further, the NPN transistor 36 has a collector connected to the other end of the resistor 37 and an emitter connected to a ground.

In the present embodiment, the mode control circuit 32 turns off both the two transistors 35 and 36 in the object detection mode and turns on the upper transistor 35 only for a very short period of time (e.g., from few milliseconds to few tens of milliseconds) in the self-diagnosis mode. When the transistor 35 is turned on only for a short period of time, a pulse voltage is applied from the oscillation unit 2, whereby the resonance unit 1 is forcibly oscillated. In addition, when the self-diagnosis is completed, the mode control circuit 32 forcibly stops oscillation of the resonance unit 1 by turning on the lower transistor 36 only for a short period of time. Although the resonance unit 1 is forcibly oscillated by applying a pulse voltage in the present embodiment, the resonance unit 1 may be forcibly oscillated by applying (supplying) a pulse current.

Figure 5:
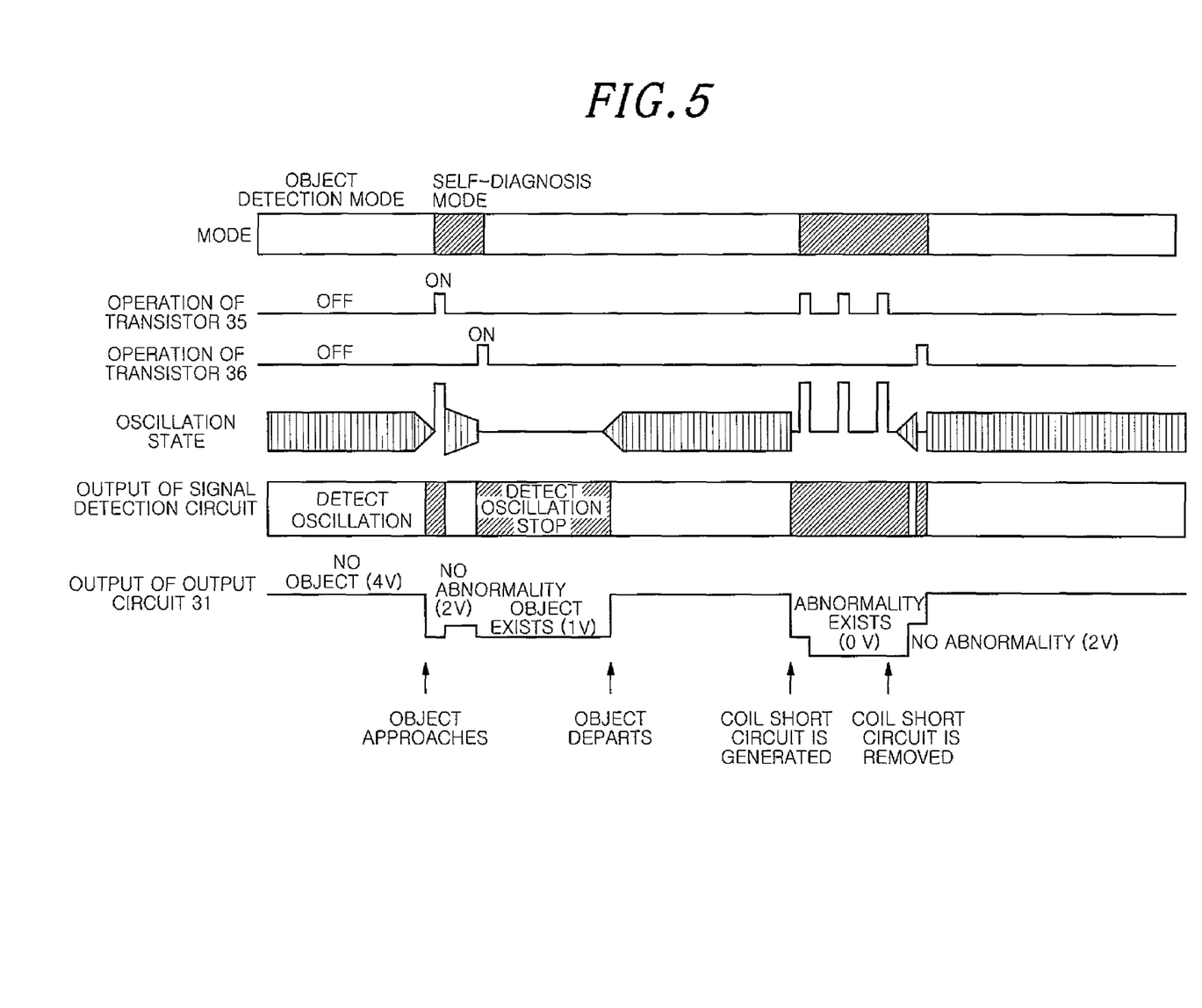
FIG. 5 is a time chart illustrating the operation of a second embodiment.

Next, the operation of the present embodiment will be described with reference to FIG. 5. Immediately after the existence of an object is detected within a detection range in the object detection mode, i.e., immediately after an oscillation stop signal is outputted from the signal detection circuit 30, the mode control circuit 32 executes the self-diagnosis mode and outputs a switch signal of low level to the output circuit 31. In the self-diagnosis mode, the mode control circuit 32 forcibly oscillates the resonance unit 1, the oscillation of which has been stopped, by turning on the transistor 35 to apply a pulse voltage as described above.

If the oscillation stop signal is not outputted from the signal detection circuit 30 in the self-diagnosis mode, the output circuit 31 determines that no abnormality occurs in the resonance unit and outputs an abnormality non-detection signal. The DC voltage level of the abnormality non-detection signal is set to be a level (2 volts) different from the level of the object detection signal (1 volt), the level of the object non-detection signal (4 volts) and the level of the abnormality detection signal (0 volt). In addition, if the oscillation stop signal is not outputted from the signal detection circuit 30 during the period of the self-diagnosis mode, the mode control circuit completes the self-diagnosis mode by turning on the transistor 36 only for a short period of time and forcibly stopping the oscillation of the resonance unit 1. Further, the mode control circuit 32 switches the operation mode from the self-diagnosis mode to the object detection mode by outputting a switch signal of high level to the output circuit 31.

Meanwhile, when the oscillation stop signal is outputted from the signal detection circuit 30 in the self-diagnosis mode, the output circuit 31 determines that an abnormality occurs in the resonance unit 1 and outputs an abnormality detection signal, and a pulse voltage is intermittently applied by turning on the transistor 35 at regular intervals, thereby continuing the self-diagnosis mode. Then, when the abnormality of the resonance unit 1 is resolved and the oscillation stop signal is not outputted from the signal detection circuit 30 while the self-diagnosis mode is continued, the mode control circuit 32 completes the self-diagnosis mode by turning on the transistor 36 only for a short period of time to forcibly stop the oscillation of the resonance unit 1. In addition, the mode control circuit 32 switches the operation mode from the self-diagnosis mode to the object detection mode by outputting a switch signal of high level to the output circuit 31.

In the present embodiment as described above, the resonance unit 1 is forcibly oscillated by applying a pulse voltage. Since the pulse voltage contains various frequency components, the oscillation of the resonance unit 1 is promptly started by applying the pulse voltage, and thus, a time required for self-diagnosis can be reduced. In addition, even when the negative conductance of the oscillation unit 2 is insufficient, the oscillation of the resonance unit 1 is damped down only for a short period of time by applying the pulse voltage, and therefore, it can be determined from the observation of the amplitude (or frequency) of the oscillation whether or not an abnormality occurs in the resonance unit 1 without continuous oscillation of the resonance unit 1.

In first embodiment, if it is determined in the self-diagnosis mode that no abnormality occurs in the resonance unit 1, the output circuit 31 maintains the detection result of the previously executed object detection mode (see FIG. 1). However, in the present embodiment, if it is determined in the self-diagnosis mode that no abnormality occurs in the resonance unit 1, the output circuit 31 outputs an abnormality non-detection signal of which DC voltage level is different from those of the object detection signal, the object non-detection signal and the abnormality detection signal. Such a configuration is effectively used in, e.g., a control to operate an apparatus in a case where an object is detected and not to operate the apparatus in a case where the existence of an object is ambiguous.

In the present embodiment, the signal processing unit 3 executes the self-diagnosis mode only when an object is detected in the object detection mode, i.e., when the oscillation stop signal is outputted from the signal detection circuit 30. That is, in the object detection mode, non-output of the oscillation stop signal from the signal detection circuit 30 means that the oscillation of the resonance unit 1 is not stopped, and thus, it can be determined that an abnormality such a disconnection or short circuit does not occur in the resonance unit 1. On the other hand, if the oscillation stop signal is outputted from the signal detection circuit 30 in the object detection mode, it cannot be determined whether the oscillation stop is a normal oscillation stop caused by the detection of an object or an abnormal oscillation stop caused by the generation of an abnormality in the resonance unit 1.

Therefore, in the present embodiment, the signal processing unit 3 executes the self-diagnosis mode when the oscillation stop signal is outputted from the signal detection circuit 30 as described above, whereby if no abnormality of the resonance unit 1 is detected, it can be determined as a normal oscillation stop caused by the detection of an object. On the contrary, if an abnormality of the resonance unit 1 is detected in the self-diagnosis mode, it can be determined as an abnormal oscillation stop which is not caused by the detection of an object.

Since the resonance unit 1 is forcibly oscillated while the signal processing unit 3 executes the self-diagnosis mode, an object cannot be detected. Accordingly, the duration of the self-diagnosis mode, in which detection of an object is disabled, is preferably set to be as short as possible. Therefore, the signal processing unit 3 in accordance with the present embodiment applies the pulse voltage only once in the self-diagnosis mode, i.e., executes the self-diagnosis mode only once. Such a configuration is effectively used, e.g., in detecting the existence of an object of which position varies at a relatively long interval.

However, since the resonance unit 1 is forcibly oscillated in the self-diagnosis mode, an oscillation stop signal may not be outputted from the signal detection circuit 30 until the oscillation of the resonance unit 1 is damped down, shortly after the signal processing unit 3 switches the operation mode from the self-diagnosis mode to the object detection mode while an object is within the detection range. Thus, in the present embodiment, since the mode control circuit 32 forcibly stops the oscillation of the resonance unit 1 when the self-diagnosis mode is completed as described above, an oscillation stop signal is promptly outputted from the signal detection circuit 30 to detect an object when the object is within the detection range immediately after the object detection mode is executed.

Meanwhile, in a case where an object is not detected in the object detection mode executed just before the self-diagnosis mode, i.e., in a case where the oscillation stop signal is not outputted from the signal detection circuit 30, if the mode control circuit 32 forcibly stops the oscillation of the resonance unit 1 upon the completion of the self-diagnosis mode as described above, the signal detection circuit 30 may erroneously output an oscillation stop signal. However, in the present embodiment, only in the case where an object has been detected, the mode control circuit 32 forcibly stops the oscillation of the resonance unit 1 upon the completion of the self-diagnosis mode, and thus, the erroneous output described above does not occur.

In addition, in the present embodiment, although the resonance unit 1 is forcibly oscillated only by applying a pulse voltage (or a pulse current) to the resonance unit 1, the resonance unit 1 can be further efficiently oscillated by combining this with increasing the absolute value of the negative conductance of the oscillation unit 2 described in first embodiment.

Third Embodiment

The present embodiment is characterized by the execution timing of the self-diagnosis mode by the signal processing unit 3. Since the configuration of the present embodiment is common to any one of the first and the second embodiments, the same constitutional elements will be denoted by the same reference numerals, and the descriptions thereof will be omitted.

Figure 6:
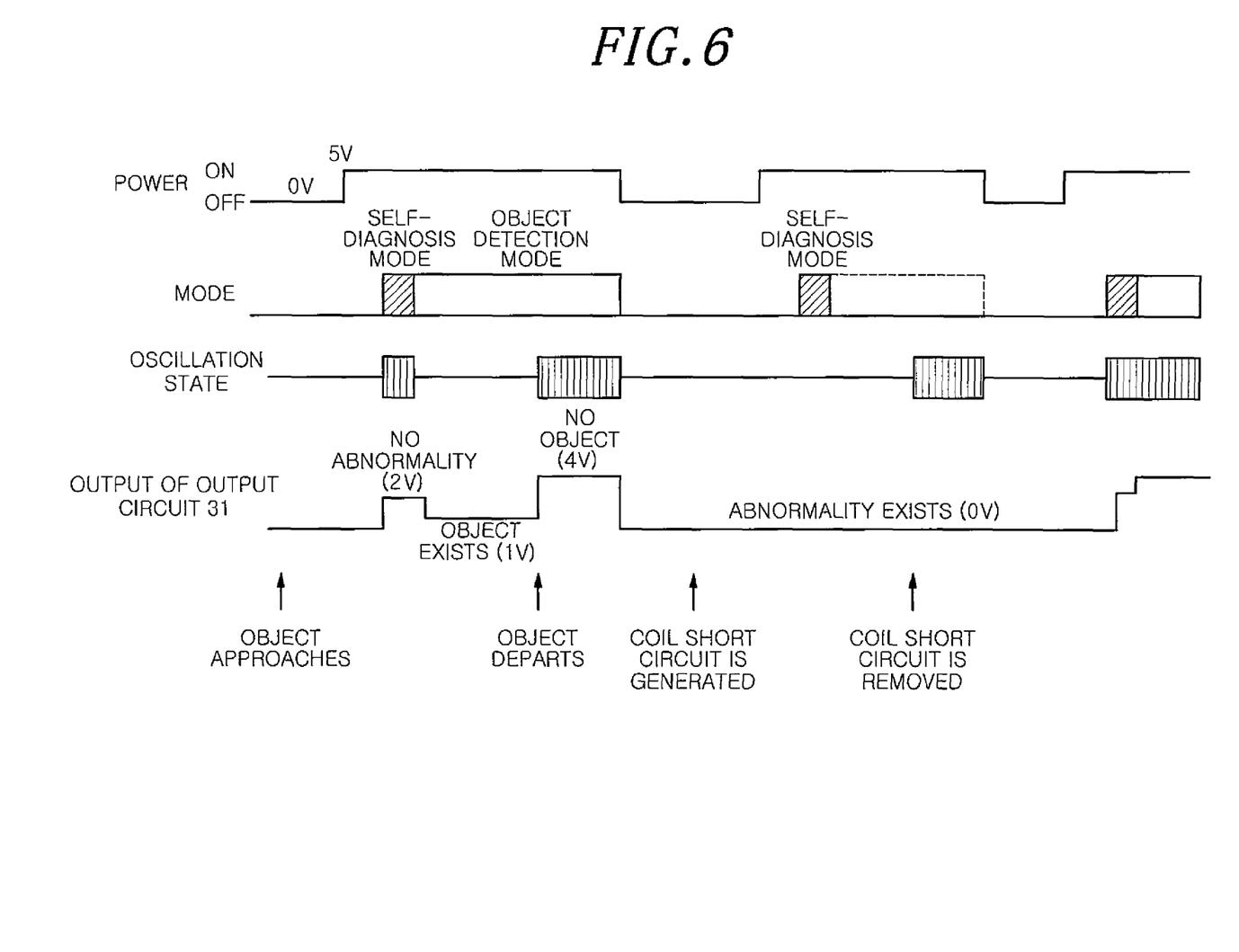
FIG. 6 is a time chart illustrating the operation of a third embodiment.

The signal processing unit 3 of the present embodiment executes the self-diagnosis mode only once immediately after being initialized.

For example, as shown in FIG. 6, when a power is applied to the detection device and operation power (a DC power of 5 volts in the illustrated embodiment) is supplied, the signal processing unit 3 starts to operate, and the self-diagnosis mode is initially executed only once and then switches to the object detection mode. Thereafter, the signal processing unit 3 executes only the object detection mode until the supply of the operation power is stopped, and the signal processing unit 3 executes the self-diagnosis mode when the supply of the operation power is resumed and it starts to operate.

The present embodiment is effective when a period during which the detection device stops an operation is longer than a period during which the detection device operates, when a probability that an abnormality occurs in the resonance unit 1 is low during the operation, or when a problem arises if an object cannot be detected during the operation of the detection device. In addition, in the present embodiment, although the signal processing unit 3 executes the self-diagnosis mode immediately after starting to operate by a power reset, the signal processing unit 3 may execute the self-diagnosis mode immediately after starting to operate by manipulating, e.g., a rest switch.

The first to third embodiments may be appropriately combined. For example, first embodiment may be implemented by combining the increase in the absolute value of the negative conductance of the oscillation unit 2 of first embodiment with the method of applying a pulse voltage (or current) of second embodiment.

While the invention has been shown and described with respect to the embodiments, the present invention is not limited thereto. It will be understood by those skilled in the art that various changes and modifications may be made without departing from the scope of the invention as defined in the following claims.

What is claimed is:
1. A detection device, comprising:
   a resonance unit including a coil and a capacitor;
   an oscillation unit for oscillating the resonance unit; and
   a signal processing unit for detecting an oscillation state of the resonance unit and outputting an object detection signal when the oscillation is stopped,
   wherein the signal processing unit intermittently executes a self-diagnosis mode for determining whether or not an abnormality occurs in the resonance unit by forcibly oscillating the oscillation unit.

2. The detection device of claim 1, wherein the signal processing unit forcibly oscillates the oscillation unit by increasing an absolute value of negative conductance of the oscillation unit.

3. The detection device of claim 2, wherein the signal processing unit forcibly oscillates the oscillation unit by increasing the absolute value of the negative conductance of the oscillation unit to be larger than a maximum value of conductance of the resonance unit.

4. The detection device of claim 1, wherein the signal processing unit forcibly oscillates the oscillation unit by applying a pulse voltage or a pulse current to the resonance unit.

5. The detection device of claim 1, wherein the signal processing unit outputs an abnormality detection signal different from the object detection signal when the abnormality is determined in the self-diagnosis mode.

6. The detection device of claim 5, wherein the signal processing unit continues outputting the abnormality detection signal until it is determined that there is no abnormality.

7. The detection device of claim 1, wherein in a case where it is determined that there is no abnormality during execution of the self-diagnosis mode, if the object detection signal is outputted just before execution of the self-diagnosis, the signal processing unit continues outputting the object detection signal.

8. The detection device of claim 1, wherein the signal processing unit outputs a signal different from the object detection signal during execution of the self-diagnosis mode.

9. The detection device of claim 1, wherein the signal processing unit periodically executes the self-diagnosis mode.

10. The detection device of claim 1, wherein the signal processing unit executes the self-diagnosis mode when it is detected that the oscillation of the resonance unit is stopped while the self-diagnosis mode is not executed.

11. The detection device of claim 10, wherein the signal processing unit executes the self-diagnosis mode only once immediately after the oscillation stop is detected.

12. The detection device of claim 1, wherein the signal processing unit executes the self-diagnosis mode only once immediately after starting to operate.

13. The detection device of claim 1, wherein the signal processing unit forcibly stops the oscillation of the resonance unit when the self-diagnosis mode is completed.

14. The detection device of claim 13, wherein when the self-diagnosis mode is completed, the signal processing unit forcibly stops the oscillation of the resonance unit only in a case where the object detection signal is outputted just before execution of the self-diagnosis mode.

* * * * *